United States Patent

Sokolov et al.

[11] 4,058,697
[45] Nov. 15, 1977

[54] ELECTRON BEAM UNIT FOR HEAT TREATMENT BY ELECTRON BOMBARDMENT TECHNIQUE

[76] Inventors: Boris Grigorievich Sokolov, Nosovikninskoe shosse, 11, kv. 64, Zheleznodorozhny Moskovskoi oblasti; Georgy Fomich Zaboronok, pereulok Obukha, 4, kv. 56, Moscow, both of U.S.S.R.

[21] Appl. No.: 628,891

[22] Filed: Nov. 3, 1975

Related U.S. Application Data

[63] Continuation of Ser. No. 304,828, Nov. 8, 1972, abandoned.

[51] Int. Cl.$^2$ .............................................. H01J 1/11
[52] U.S. Cl. .............................. 219/121 EB; 250/501; 250/493; 315/111.8; 313/414
[58] Field of Search ................. 219/121 EM, 121 EB; 250/493, 501, 526; 315/111.8, 199

[56] References Cited

U.S. PATENT DOCUMENTS

| | | | |
|---|---|---|---|
| 2,786,156 | 3/1957 | Lorenz | 219/121 EB X |
| 3,009,050 | 11/1961 | Steigerwald | 219/121 EB X |
| 3,303,319 | 2/1967 | Steigerwald | 219/121 EM |
| 3,308,263 | 3/1967 | Schleich | 219/121 EB |
| 3,347,701 | 10/1967 | Yamagishi et al. | 219/121 EM X |
| 3,678,334 | 7/1972 | Dugdale et al. | 315/111.2 |
| 3,826,889 | 7/1974 | Brukovsky | 315/119 X |

*Primary Examiner*—C. L. Albritton
*Assistant Examiner*—Mark H. Paschall

[57] ABSTRACT

An electron beam unit for heat treatment by the electron bombardment technique wherein the resistor for limiting the discharge current arising in the vacuum chamber between the cathode and the accelerating electrode of the electron beam gun is connected between the positive pole of the power supply and the accelerating electrode, the accelerating electrode being insulated from the material being processed by means of an insulator.

3 Claims, 1 Drawing Figure

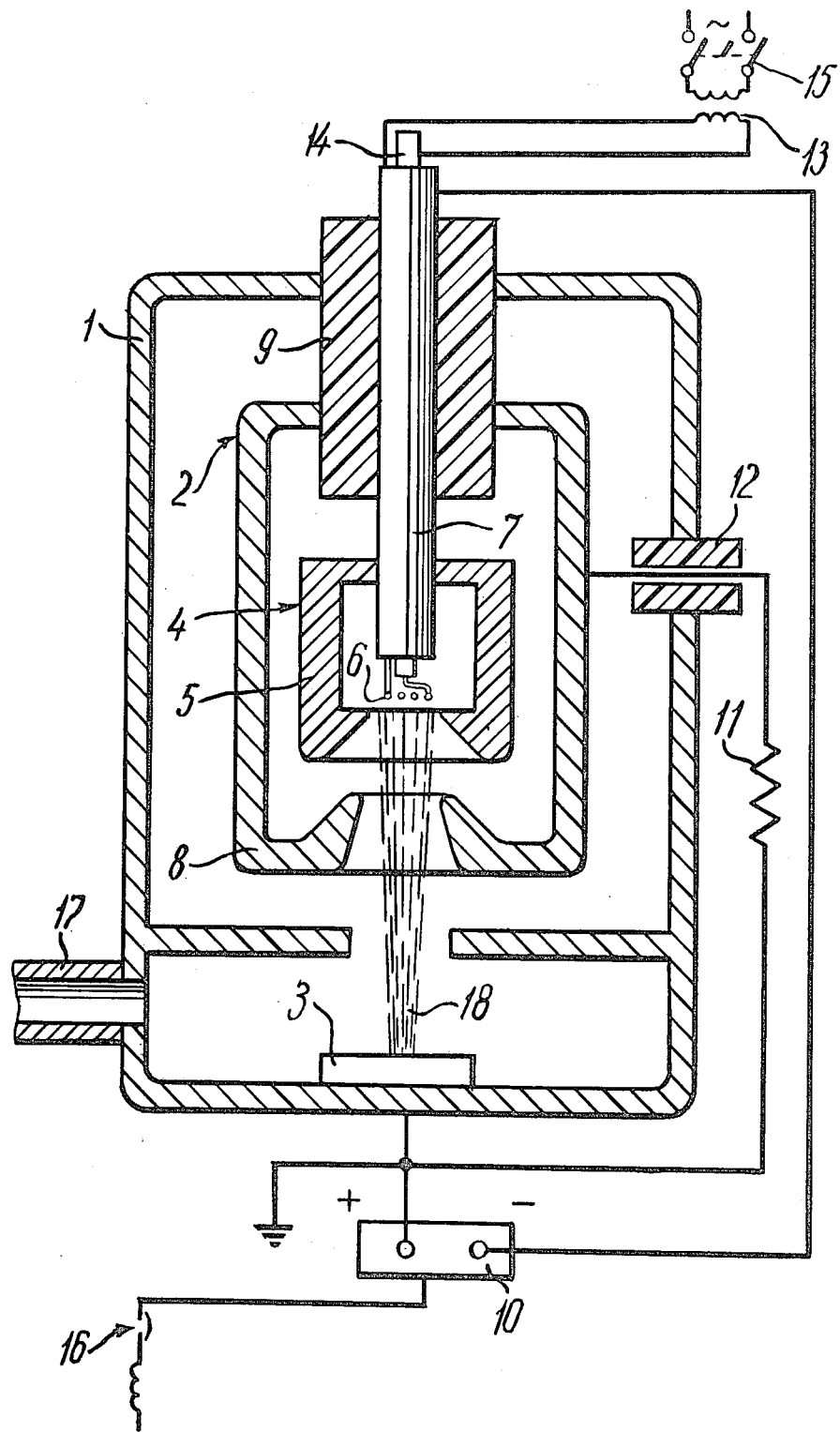

ELECTRON BEAM UNIT FOR HEAT TREATMENT BY ELECTRON BOMBARDMENT TECHNIQUE

This application is a continuation of copending application Ser. No. 304,828 filed Nov. 8, 1972, now abandoned.

This invention relates to equipment for electrothermics and electrophysical processing techniques and, more particularly, it is concerned with electron beam units for heat treatment by the electron bombardment technique.

Known in the art are electron beam units for heat treatment by electron bombardment, wherein use is made of high-resistance resistors to limit the discharge current that arises between the cathode and the accelerating electrode of the electron beam gun.

The prior art electron beam units for heat treatment by the electron bombardment technique are in the form of a vacuum chamber which accommodates the material (item) to be processed and an electron beam gun having an electron-emitting cathode and an accelerating electrode for shaping the emitted electrons into an electron beam directed onto the material (item) being processed, wherein the cathode and the accelerating electrode are electrically insulated from the material being processed, the accelerating electrode and said material (item) are connected to the positive pole of a power supply, while the negative pole of said power supply is connected to the cathode of the electron beam gun, and provision is made in the power supply circuit for a resistor intended to limit the discharge current that arises between the cathode and accelerating electrode of the electron beam gun, said resistor being connected so that the entire electron beam current passes therethrough.

Said electron beam unit for heat treatment by the electron bombardment technique is disadvantageous in that effective protection of the power supply of such units from short-circuit currents necessitates the employment of a high-resistance resistor for limiting the discharge current, said resistor connected as indicated hereinabove being responsible for significant power losses, while failing to provide complete protection of the power supply.

Another disadvantage of the known electron beam unit stems from excessively elaborate circuitry due to the necessity of incorporating therein additional power supply protection means such as, for example, reactors, dischargers or quick-response automatic maximum current limiters.

A further disadvantage is associated with the fact that in the known electron beam units maintaining the requisite steady low pressure in the electron beam gun zone calls for the employment of a multistage pumping vacuum system, whereby said units are rendered excessively complicated.

It is an object of the present invention to provide an electron beam unit for heat treatment by the electron bombardment technique in which complete protection of the power supply involves insignificant power losses in the resistor.

It is another object of the present invention to provide an electron beam unit for heat treatment by the electron bombardment technique in which the number of pumping system stages is minimized.

In accordance with these and other objects, the present invention provides an electron beam unit for heat treatment by the electron bombardment technique comprising a vacuum chamber that accommodates a material (item) to be heat treated and an electron beam gun having an electron-emitting cathode and an accelerating electrode that shapes the emitted electron into an electron beam directed onto said material (item), said cathode and said accelerating electrode being electrically insulated from said material, said accelerating electrode and said material being connected to the positive pole of a power supply, the negative pole of said power supply being connected to the electron beam gun cathode, and the power supply network incorporating a resistor for limiting the discharge current arising between said cathode and said accelerating electrode of the electron beam gun wherein, according to the invention, said discharge current limiting resistor is connected by one lead thereof to the positive pole of the power supply, while the other lead thereof is connected to said material and said accelerating electrode which is electrically insulated from said material by a insulator whose dielectric strength corresponds to that of the cathode insulation, whereby said resistor is shunted by the electron beam during electron gun normal performance, while the onset of a discharge between the cathode and the accelerating electrode of the electron gun switches on said resistor.

The employment of the present electron beam unit for heat treatment by the electron bombardment technique provides for complete protection of the power supply from the discharge current at a minimum power loss in the discharge current limiting resistor.

Other objects and advantages of the present invention will become apparent from the description of an exemplary embodiment thereof with reference to an accompanying drawing the sole FIGURE of which is a sectional view of the electron beam unit for heat treatment by the electron bombardment technique, according to the invention.

The electron beam unit for heat treatment by the electron bombardment technique comprises a vacuum chamber 1 and an electron beam gun 2, under which there is disposed a material (item) 3 to be heat treated. In the electron beam gun 2 provision is made for a cathode 4, which is an electron flow source and consists of a focusing electrode 5 and an emitter 6, the emitter 6 being a tungsten coil. To mount the cathode 4 in the vacuum chamber 1, use is made of a hollow rod 7, which serves as a tubular current conductor of the emitter 6. The accelerating electrode 8 of the electron beam gun 2 is electrically insulated from the material (item) 3 by means of a high-voltage insulator 9. Disposed outside the vacuum chamber 1 is a high-voltage power supply 10, whose positive pole is connected to the material 3 being heat treated via the casing of the vacuum chamber 1 and to the accelerating electrode 8 via the discharge current-limiting high-resistance resistor 11, the lead-in of said resistor 11 being introduced into the vacuum chamber 1 via a high-voltage through insulator 12. The negative pole of said high-voltage power supply 10 is coupled to the hollow rod 7, which is insulated from both the casing of the vacuum chamber 1 and the accelerating electrode 8 by a high-voltage insulator 9. Heating the emitter 8 is effected by a transformer 13 whose secondary winding is connected with one end thereof to the hollow rod 7, while the other end of said winding is connected to an insulated current lead 14 disposed inside said hollow rod 7.

The transformer 13 circuit is energized by means of a double-pole switch 15, whereas a switch 16 serves for applying the voltage from the high-voltage power supply 10 to the electron beam unit. Use is made of a connection 17 to set the vacuum chamber 1 in communication with the pumping system.

The present electron beam unit for heat treatment by the electron bombardment technique functions in the following manner.

The material 3 to be heat treated, viz., a metal melt stock, is placed in the vacuum chamber 1, which is thereafter evacuated through the connection 17 to attain in said vacuum chamber 1 a vacuum of the order of $1 \times 10^{-4}$ mm of Hg. Next the switch 16 switches on the high-voltage power supply 10, thereby applying an accelerating voltage to the electron beam gun 2 in which there arises an electrostatic field between the focusing electrode 5 and emitter 6, on the one side, and the accelerating electrode 8, on the other, said electrostatic field being instrumental in accelerating the electron flow and focusing said electron flow to obtain an electron beam. The switch 15 makes the mains transformer 13 and the secondary current heats the emitter 6 which, on being heated to the temperature of thermoelectronic emission, yields an electron flow shaped to obtain an electron beam 18, the electrons of said beam 18 bombarding and heating the material 3 (melt stock). Thus, the external circuit of the power supply 10 will be closed via the material 3, electron beam 18, cathode 4, and the hollow rod 7 so that the electron beam 18 will shunt the high-resistance resistor 11 connected between the accelerating electrode 8 and the power supply 10. A leakage current to the accelerating electrode 8 is as small as a few tens of milliamperes and is shunted in the circuit section from the positive pole of the power supply 10 to the cathode 4 across the high-resistance resistor 11 (resistance up to a few hundreds of kohms) and the accelerating electrode 8.

Hence, during normal performance of the present electron beam unit, power losses across the high-resistance resistor 11 are insignificant.

In the course of heating the metal melt stock 3, particularly during melting said stock, there evolves a significant amount of gas from the metal volume being melted. When the evolved gas penetrates into the zone of the cathode 4 and accelerating electrode 8, discharge phenomena between the cathode 4 and the accelerating electrode 8 are likely to occur.

The discharge current in this case may exceed the rated electron beam current by one or two orders of magnitude and cause the destruction of the working surfaces of the electrodes of the electron beam gun 2. Discharge onset is accompanied by a sharp drop of the resistance between the cathode 4 and the accelerating electrode 8, the attendant overvoltage in the electric circuit of the high-voltage power supply 10 being hazardous in that it may result in power supply failure. The situation described hereinabove is, however, excluded as far as the present electron beam unit is concerned, inasmuch as discharge onset is accompanied in this case by a sharp increase of the current in the circuit formed by the positive pole of the power supply 10, high-resistance resistor 11, accelerating electrode 8, cathode 4, hollow rod 7, and the negative pole of the power supply 10. Said current growth results in voltage drop across the high-resistance resistor 10, so that on the accelerating electrode 8 there appears a negative potential which is nearly equal to the potential of the cathode 4, thereby arresting the progress of electric discharge phenomena between the accelerating electrode 8 and the cathode 4.

On electric discharge termination, the electric charge accumulated on the accelerating electrode 8 commences to flow off said electrode 8 via the high-resistance resistor 11, and the initial accelerating voltage fed from the power supply 10 will be restored on the electrodes of the electron beam gun 2. Now the electron beam 18 again shunts the resistor 11 and power dissipation in said resistor 11 will be insignificant.

The present electron beam unit for heat treatment by the electron bombardment technique is suited for melting, welding or atomizing diverse metals and non-metals, other fields of application of the present electron beam unit being ingot surface treatment by partial melting and uniform pre-processing of blanks.

The employment of the present electron beam unit provides the protection of high-voltage power supply from discharge currents by using a resistor whose resistance is several hundred or thousand times as great as that of resistors used in the known electron beam units. This feature of the electron beam unit, according to the present invention, makes for complete protection of power supply at a negligible power loss and avoids the use of diverse auxiliary protective means such as, for example, reactors, discharges or quick-response automatic maximum current limiters.

In the present electron beam unit, the discharge current, by proper selection of a resistor for discharge current limitation, is not in excess of the rated electron beam current, thereby the possibility of damaging or destructing the surface of electron beam gun electrodes is avoided. In the present electron beam gun, discharge current limitation occurs at the initial stage of discharge progress, so that the electron beam gun of said unit will operate steadily when the pressure in the vacuum chamber is at least by half an order of magnitude greater than the pressure required for the steady operation of electron beam guns in the prior art electron beam units. The vacuum system of the present electron beam unit for heat treatment by the electron bombardment technique is less sophisticated due to a decreased number of pumping stages for vacuum chamber evacuation.

What we claim is:

1. An electron beam unit for heat treatment by the electron bombardment technique comprising a vacuum chamber with the item being processed contained therein; an electron beam gun disposed inside said vacuum chamber; said electron beam gun including an electron-emitting cathode, an accelerating electrode so disposed in relation to said cathode that said accelerating electrode in conjunction with said cathode shapes the emitted electrons to obtain an electron beam; insulator means electrically insulating said cathode from said accelerating electrode, said insulator means being disposed between said item being processed and said accelerating electrode for also electrically insulating said accelerating electrode from ground; whereby the same electrical insulator strength is provided between the cathode and accelerating electrode and between the item and the accelerating electrode, a power supply disposed in external relationship to said vacuum chamber, the positive pole of said power supply being connected to said item, while the negative pole of the power supply is connected to said cathode of said electron beam gun; a resistor for limiting the discharge current that arises between said cathode and said accelerating electrode, one lead of said resistor being connected to said item and said positive pole of said power supply while the other lead of said resistor is connected directly to said accelerating electrode so that, in the normal operating mode of said electron beam gun, said resistor is shunted by said electron beam whereas the onset of a discharge between said cathode and said accelerating electrode will switch-in said resistor.

2. An electron beam unit as claimed in claim 1, wherein said insulator means comprises a single insulator element.

3. An electron beam unit as claimed in claim 2, comprising a frame on which said item is mounted, said frame being connected to ground, said insulator element being between the frame and the accelerating electrode and between the cathode and the frame and accelerating electrode.

* * * * *